(12) United States Patent
Lee et al.

(10) Patent No.: US 6,277,722 B1
(45) Date of Patent: Aug. 21, 2001

(54) METHOD FOR FORMING POLY METAL GATE

(75) Inventors: Sang Moo Lee; Jin Hong Lee, both of Kyoungki-do (KR)

(73) Assignee: Hyundai Electronics, Kyoungki-do (KR)

( * ) Notice: Subject to any disclaimer, the term of this patent is extended or adjusted under 35 U.S.C. 154(b) by 0 days.

(21) Appl. No.: 09/594,896

(22) Filed: Jun. 15, 2000

(30) Foreign Application Priority Data

Jun. 24, 1999 (KR) .................................................. 99-24047

(51) Int. Cl.[7] ....................... H01L 21/336; H01L 21/4763
(52) U.S. Cl. ..................... 438/592; 438/595; 438/299; 438/303; 438/653; 438/656
(58) Field of Search ........................... 438/592, 584–596, 438/299–308, 287–291, 653, 656, 657

(56) References Cited

U.S. PATENT DOCUMENTS

| | | |
|---|---|---|
| 5,573,961 | 11/1996 | Hsu et al. . |
| 5,631,179 * | 5/1997 | Sung et al. ............................. 438/264 |
| 5,736,455 * | 4/1998 | Iyer et al. ............................. 438/596 |
| 5,766,998 | 6/1998 | Tseng . |
| 5,851,927 * | 12/1998 | Cox et al. ............................. 438/744 |
| 5,869,359 | 2/1999 | Prabhakar . |
| 6,075,274 * | 6/2000 | Wu et al. ............................. 438/595 |
| 6,136,658 * | 10/2000 | Shinmura ............................. 438/305 |
| 6,162,741 * | 12/2000 | Akasaka et al. ..................... 438/773 |

FOREIGN PATENT DOCUMENTS

| | | | |
|---|---|---|---|
| 2298023 | * | 12/1990 | (JP) ............................. H01L/21/265 |
| 06196704 | | 7/1994 | (JP) . |
| 6196704 | | 7/1994 | (JP) . |

* cited by examiner

*Primary Examiner*—Charles Bowers
*Assistant Examiner*—Thanh Nguyen
(74) *Attorney, Agent, or Firm*—Pillsbury Winthrop LLP

(57) ABSTRACT

A method for forming a poly metal gate, comprising the steps of: providing a substrate where a gate oxide is formed; forming a polysilicon film, a barrier metal, a refractory metal film and a hard mask over the gate oxide; patterning the hard mask, the refractory metal film, the barrier metal and the polysilicon film to form a gate metal gate; forming a capping layer for oxidation prevention over the gate oxide to cover the poly metal gate; etching the capping layer for oxidation prevention to remain in sidewalls of the poly metal gate; carrying out a heat treatment using a H2 gas to cover a damage of the capping layer for oxidation prevention in the capping layer etching step; and carrying out a reoxidation process to recover a damage caused in the etching step for the formation of the poly metal gate and improve reliability of the gate oxide.

4 Claims, 2 Drawing Sheets

METHOD FOR FORMING POLY METAL GATE

BACKGROUND OF THE INVENTION

1. Field of the Invention

This invention relates to a method for forming a gate, and more particularly to a method for forming a poly metal gate having a stack structure of a refractorymetal film, a barrier film and a polysilicon film.

2. Description of the Related Art

As well known, a polysilicon is widely used as an electrode material and an interconnection material in semiconductor devices. As integration degree and speed of devices are increased, the signal transfer delay arises from the resistances of an electrode and an interconnection. The delay is suppressed by lowering the resistances of an electrode and an interconnection. For example, in case of a gate electrode in a MOS transistor, the delay is suppressed by using a two-layered polycide gate of a metal silicide film and a polysilicon film.

However, if the gate electrode has a length of below 0.25 µm, the use of a gate electrode having resistance lower than the polycide gate is demanded. Recently, a poly metal gate having a stack structure of a refractory metal film, a barrier metal film and a polysilicon film is remarked. For example, if a tungsten film is used as a refractory metal film, the RC delay time can be remarkably reduced because the resistivity of the tungsten is smaller than that of the tungsten silicide $Wsi_x$ by approximately an order of magnitude. On the other hand, tungsten is a material that reacts with polysilicon in the heat treatment of about 600° C. But the barrier metal disposed between the tungsten and polysilicon prevents the reaction between them.

Generally, in the LSI manufacturing process, it is necessary to carry out reoxidation process so as to improve reliability of an oxide such as a gate oxide, following the formation of a gate electrode. However, if the reoxidation process is adapted to a poly metal gate using tungsten as a refractory metal, tungsten is easily oxidized so that the delay of the poly metal gate using tungsten as a refractory metal becomes larger. That is, tungsten is oxidized at a temperature of about 400° C. and the tungsten oxide is an insulating material. Tungsten causes a cubical expansion in oxidation and an exposed portion of the tungsten film is oxidized during the reoxidation process so that the delay of the poly metal gate using tungsten as a refractory metal becomes more increased.

On the other hand, in case where a portion of Si is exposed as well as a portion of refractory metal is exposed like the poly metal gate, a selective oxidation method which selectively oxidizes only the exposed Si without oxidizing the exposed refractory metal, has bee used. When the poly metal gate using tungsten as a refractory metal is formed, the selective oxidation technique solves the problem that the exposed tungsten film as a refractory film is oxidized in the reoxidation process. However, the selective oxidation technique is performed in a high temperature and has a thermal budget problem so that it is substantially impractical. Recently, the technique for forming a capping layer for preventing oxidation in the exposed portion of the refractory metal such as tungsten is proposed. A nitride film is used as the capping layer for preventing oxidation. The nitride film is deposited over a substrate to cover the poly metal gate, before the reoxidation. Then the nitride film is etched by a reactive ion etching method to remain in the sidewalls of the poly metal gate including the exposed portion of the refractory metal.

However, the technique using the capping layer has a disadvantage in that the exposed portion of the tungsten film is oxidized as usual in the following reoxidation in spite of the formation of the nitride film for oxidation prevention. It is because the nitride film for oxidation prevention is damaged in the previous etching process. Therefore, because the reoxidation is carried out under the state that the nitride film is damaged, the oxidizing gas that is penetrated through the damaged portion of the nitride film oxidizes the exposed portion of the tungsten film. Besides, if the exposed portion of the tungsten film is oxidized, the cohesive force between the tungsten film and the nitride film becomes poorer and the lifting of the nitride film is caused.

SUMMARY OF THE INVENTION

It is an object of the present invention to provide a method for forming a poly metal gate for preventing a tungsten film using as a refractory film from oxidizing in reoxidation process.

According to an aspect of the present invention, there is provided to a method for forming a poly metal gate, comprising the steps of: providing a substrate where a gate oxide is formed; forming a polysilicon film, a barrier metal, a refractory metal film and a hard mask over the gate oxide; patterning the hard mask, the refractory metal film, the barrier metal and the polysilicon film to form a gate metal gate; forming a capping layer for oxidation prevention which is a nitride film over the gate oxide to cover the poly metal gate; etching the capping layer for oxidation prevention to remain in sidewalls of the poly metal gate; carrying out a heat treatment in a $H_2$ gas ambient to recovery a damage of the capping layer for oxidation prevention which is caused in the etching step of the capping layer; and carrying out a reoxidation process to recover a damage caused in the etching step for the formation of the poly metal gate and improve reliability of the gate oxide.

BRIEF DESCRIPTION OF THE DRAWINGS

The objects and features of the invention may be understood with reference to the following detailed description of an illustrative embodiment of the invention, taken together with the accompanying drawings in which.

DETAILED DESCRIPTION OF THE INVENTION

Figure 1:
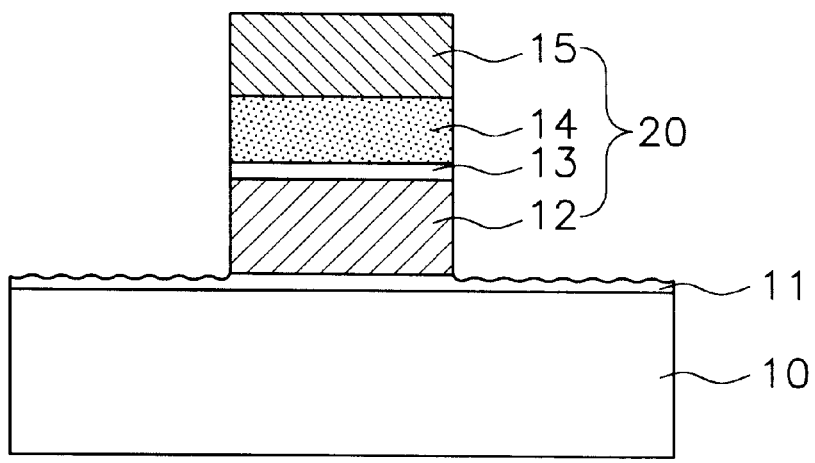
FIG. 1 to FIG. 4 are sectional views illustrating a method for forming a poly metal gate in accordance with an embodiment of the present invention.

Referring to FIG. 1, a substrate 10 where a gate oxide 11 is formed by a thermal growth method or a deposition method is provided. A doped polysilicon film 12, a barrier metal 13, a refractory metal 14, for example a tungsten film and a hard mask 15 are formed over the gate oxide in turn. The polysilicon film 12 is deposited at a thickness of 500 to 1,000 Å. The barrier metal 13 is preferably a metal nitride film such as a tungsten nitride film WN or a titanium nitride film TiN and is deposited at a thickness of 50 to 150 Å. The tungsten film 14 for a refractory metal is deposited at a thickness of 500 to 1,000 Å.

A mask pattern, for example a photosensitive pattern (not shown) is formed over the hard mask 15 by a photolithographic process. The hard mask 15, the tungsten film 14, the barrier metal 13 and the polysilicon film 12 are successively etched by an etching process using the mask pattern to form a poly metal gate 20.

Figure 2:
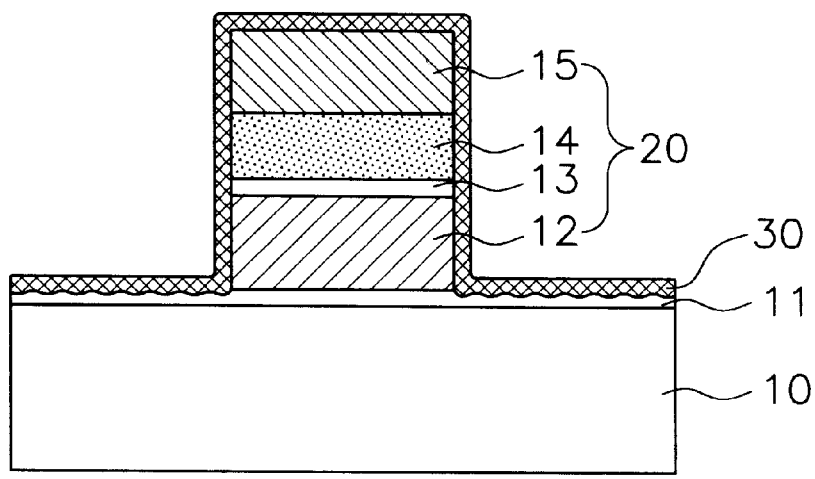

Referring to FIG. 2, a nitride film 30 for oxidation prevention is formed over the gate oxide 11 to cover the poly metal gate 20. The nitride film 30 is deposited at a thickness of 50–500 Å by a low pressure chemical vapor deposition method (LPCVD).

Figure 3:
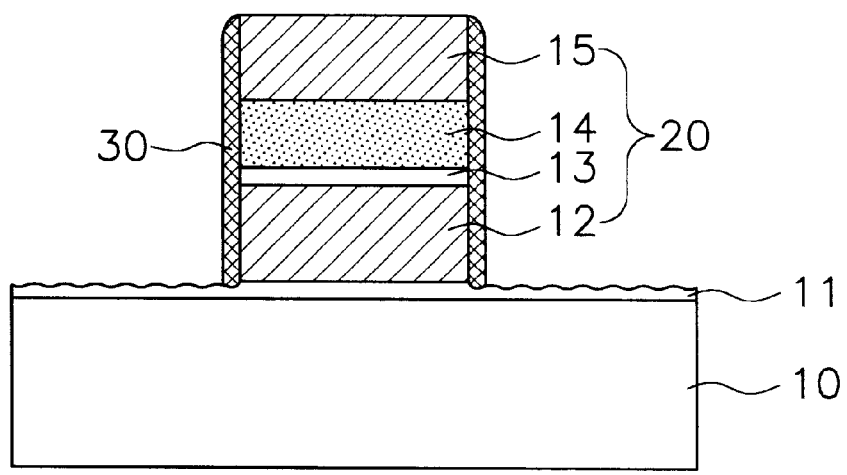

Referring to FIG. 3, the nitride film 30 is etched by a reactive ion etching method to remain only in the sidewalls of the poly metal gate 20. The nitride film 30 which remains in the sidewalls of the poly metal gate 20 is damaged during the reactive ion etching process. As above described, if the reoxidation is carried out under the condition that the damage of the nitride film is not recovered, the tungsten film is oxidized by penetrating the oxidizing gas through the damaged portion of the nitride film. Accordingly, the resistance of the polymetal gate becomes increased and the lifting of the nitride film is caused.

So as to solve the problem descried as above, the heat treatment using a $H_2$ gas is performed in the embodiment of this invention. The damage of the nitride film 30 caused in the previous etching process is recovered with the heat treatment. The heat treatment is performed at a temperature of 600–900° C. for 1 to 2 minutes at an ambient of $H_2$.

Figure 4:
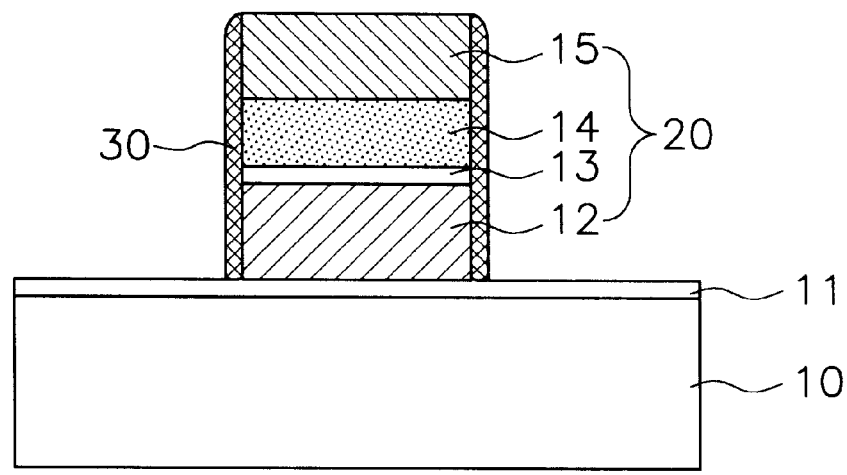

Referring to FIG. 4, the reoxidation process is performed to form the final poly metal gate 20. The reoxidation process recovers the damage caused in the etching process for forming the poly metal gate and improves the reliability of the gate oxide 11. A dry oxidation, a wet oxidation, or a rapid thermal oxidation process is used for the reoxidation. At this time, because the damage of the nitride film which remains in the sidewalls of the poly metal gate 20 is recovered through the previous heat treatment, the penetration of the oxidizing gas through the exposed portion of the tungsten film 13 is prevented in the reoxidation process. Therefore, because the reoxidation is carried out only in the Si, the damage caused in the etching process is recovered and the reliability of the gate oxide is improved as well as the oxidation of the tungsten film is not prevented.

According to the present invention, the damage of the capping layer for oxidation prevention, which covers the exposed portion of the refractory metal is recovered through the heat treatment. As a result, the oxidation of the refractory metal is prevented in the reoxidation process and the poly metal gate having a low resistance can be obtained so that it is applicable to fabricate semiconductor devices with high integration.

While the invention has been particularly shown and described with respect to preferred embodiment thereof, it will be understood by those skilled in the art that various changes in form and details may be made therein without departing from the spirit and the scope of the invention as defined by the following claims.

What is claimed is:

1. A method for forming a poly metal gate, comprising the steps of:

providing a substrate where a gate oxide is formed;

forming a polysilicon film, a barrier metal, a refractory metal film and a hard mask over the gate oxide;

patterning the hard mask, the refractory metal film, the barrier metal and the polysilicon film to form a gate metal gate;

forming a capping layer for oxidation prevention over the gate oxide to cover the poly metal gate;

etching the capping layer for oxidation prevention to remain in sidewalls of the poly metal gate;

carrying out a heat treatment using a $H_2$ gas to cover a damage of the capping layer for oxidation prevention in the capping layer etching step; and carrying out a reoxidation process to recover a damage caused in the etching step for the formation of the poly metal gate and improve reliability of the gate oxide.

2. The method as claimed in claim 1, wherein the capping layer is a nitride film deposited by a LPCVD.

3. The method as claimed in claim 2, wherein the nitride film is formed at a thickness of 50–500 Å.

4. The method as claimed in claim 1, wherein the heat treatment for recovering the damage of the capping layer is carried out at a temperature of 600–900° C. for 1–2 minutes.

* * * * *